United States Patent [19]
Kim et al.

[11] Patent Number: 5,942,040
[45] Date of Patent: Aug. 24, 1999

[54] MULTI-TARGET MANIPULATOR FOR PULSED LASER DEPOSITION APPARATUS

[75] Inventors: Je-Ha Kim; Seok-Kil Han; Kwang-Yong Kang, all of Daejeon, Rep. of Korea

[73] Assignee: Electronics and Telecommunications Research Institute, Daejeon, Rep. of Korea

[21] Appl. No.: 08/919,006

[22] Filed: Aug. 27, 1997

[30] Foreign Application Priority Data

Aug. 27, 1996 [KR] Rep. of Korea ............ 96-35748

[51] Int. Cl.[6] .................................. C23C 14/00
[52] U.S. Cl. ............................ 118/726; 427/596
[58] Field of Search ............... 118/726, 715; 427/596

[56] References Cited

U.S. PATENT DOCUMENTS

| | | | |
|---|---|---|---|
| 5,212,148 | 5/1993 | Roas | 427/596 |
| 5,534,071 | 7/1996 | Varshney | 118/726 |
| 5,747,120 | 5/1998 | McLean | 427/596 |

*Primary Examiner*—Richard Bueker
*Attorney, Agent, or Firm*—Cohen, Pontani, Lieberman & Pavane

[57] ABSTRACT

Disclosed is a multi-target manipulator for a pulsed laser deposition apparatus. The multi-target manipulator for a pulsed laser deposition apparatus grows a thin film having both a high quality and a repeatability, automatizes a deposition apparatus, and economically performs a pulsed laser deposition, when a thin film is grown by using a pulsed laser deposition apparatus. The multi-target manipulator for a pulsed laser deposition apparatus includes: a driving power providing member which includes a stepping motor and a motion feedthrough thereby providing a rotation driving power to the target disk driving shaft and the target driving motor shaft; a driving power transmission and head supporting member, thereby transmitting a rotation driving power necessary for rotating both the target disk provided from the driving power providing member and the target and supporting the head of the target manipulator; and a head portion, thereby performing rotations of the target disk and the target so as to locate a target material on the focal point of the laser beam.

13 Claims, 5 Drawing Sheets

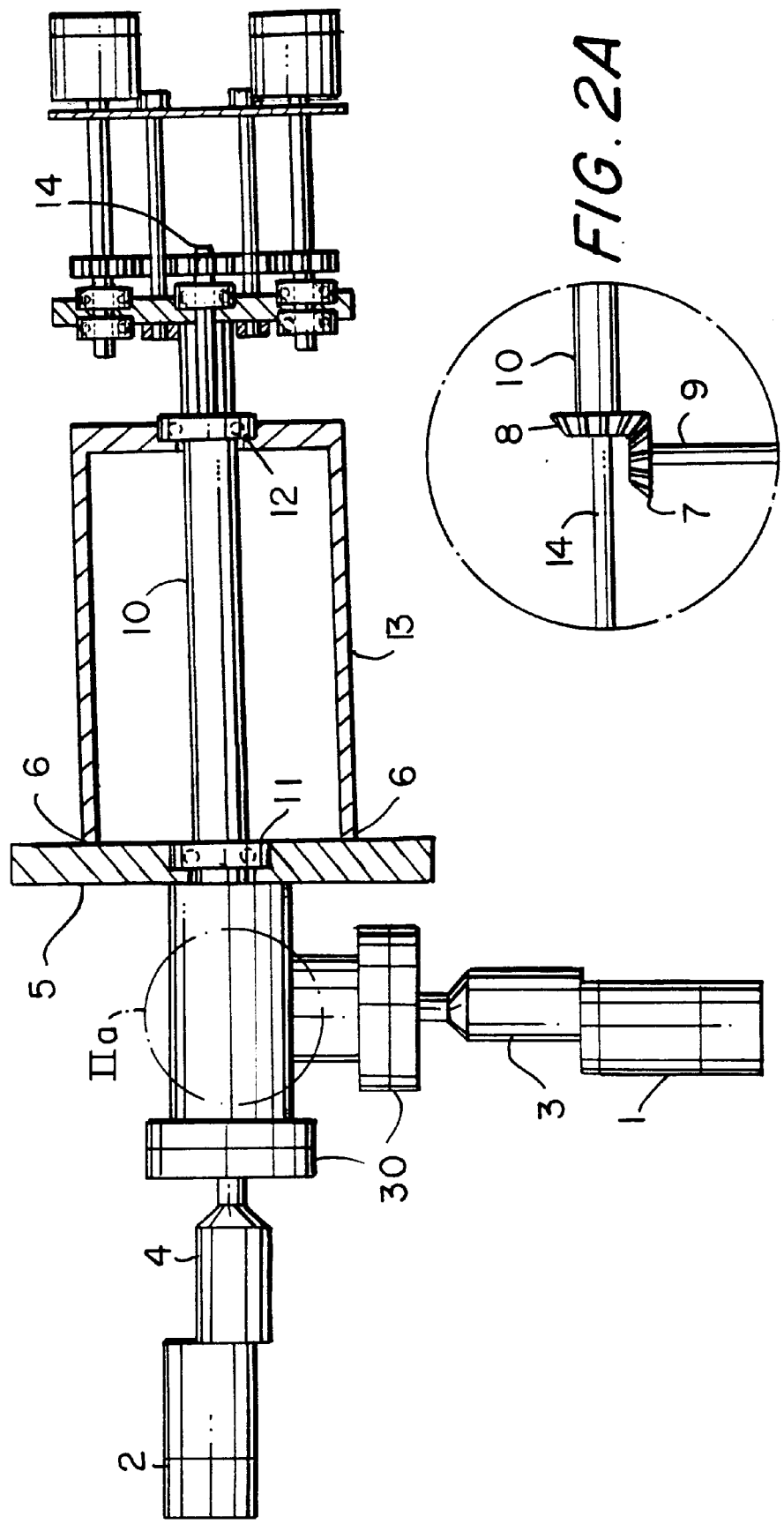

MULTI-TARGET MANIPULATOR FOR PULSED LASER DEPOSITION APPARATUS

BACKGROUND OF THE INVENTION

1. Field of the Invention

The present invention generally relates to a multi-target manipulator for a pulsed laser deposition apparatus. More particularly, it relates to a multi-target manipulator which grows a thin film having both a high quality and a repeatability, automatizes a deposition apparatus, and economically performs deposition, when a thin film is grown by using a pulsed laser deposition apparatus.

2. Description of the Conventional Art

In thin film deposition methods for growing a thin film on a single crystal substrate and an amorphous substrate, a pulsed laser deposition (or a laser ablation) which forms a thin film having a constant thickness on a semiconductor substrate by using the atomic vapor generated by applying a pulsed laser to a target material is one of thin film fabrication methods by a physical method generally used.

The pulsed laser deposition apparatus used in the pulsed laser deposition method includes:

a laser generation apparatus for generating a laser light having a wavelength range of 100–400 nm; and a target driving apparatus for driving a target material;

an electric heater for attaching and fixing a substrate and a heat treatment. Herein, the target driving apparatus and the electric heater are installed in a vacuum chamber.

A thin film growth using the pulsed laser deposition apparatus is achieved in the reactive gas atmosphere of hundreds of mTorrs, uses oxygen as the reactive gas in oxidized substances, and uses argon as the reactive gas in metallic materials and high-polymer materials.

In order to deposit the target material on a substrate using a pulsed laser deposition method, high-energy laser beam having an ultraviolet wavelength is used as an energy source. Such a laser beam is focused at the target material within the vacuum chamber through both a focusing lens and a quartz window, after being generated from the laser generation apparatus.

At this time, the condensed area on the target material occupies tens of $mm^2$. In this way, the laser beam of high-energy condensed on such a narrow area melts the target material, thus generates a laser plume of atomic vapor. The vaporized atoms flies to a substrate being faced forward the target at the speed of tens of kilometers per an hour. Likewise, the atoms arrived at the substrate form an atomic layer deposited on the substrate by a self-chemical reaction and a reaction between the atoms and the substrate constituent atoms. The atomic layer has the same composition as the target material maintaining at a minimum binding energy. In this case, if the substrate is exposed to the laser plume for a predetermined time, then thin film having a constant thickness can be grown on the substrate.

The position of a focused laser beam in a laser deposition apparatus is varied according to the position of a quartz window through which the laser beam is passed. The focused area on a target material is varied depending on a focal length and a position of the focusing lens.

Accordingly, selecting properly the quartz window and the focusing lens is very important for condensing the laser beam energy to a fixed point inside a vacuum chamber. At the focal point, a deposited material is vaporized by the highly condensed laser energy.

In order to grow a high-quality thin film by using the target material with which a deposition is performed, the target material should be positioned near the focal point of a fixed laser beam within the vacuum chamber. In forming the thin film on the substrate, a reproducibility of the thin film is a very important parameter in addition to the high-quality characteristic thereof. To achieve the reproducibility, a mechanical accuracy which repeatably positions the target on a predetermined laser focal point should be assured. As a result, the target manipulator which can precisely drive a given target is required.

Generally, four targets or more targets can be mounted on this target manipulator. The reason why several target materials are mounted on the target manipulator is for an advantage wherein a multilayer thin film is manufactured as many as the number of allowable targets (four or more) without break the vacuum when the system is under vacuum.

Also, the design is very useful when a buffer layer is firstly formed on the substrate before growing the main thin film or when a special thin film such as an artificial superlattice structure is formed on a substrate.

As described above, in case a plurality of targets are used, the target manipulator should be designed to perform two kinds of motions as follows:

Firstly, a motion mechanism should move a specific target on a focal point of the laser beam. In this motion mechanism, a plurality of targets (i.e., a multi-target) on the target disk are arranged on a single circumference with an equal distance therebetween, and the focal point of the laser beam are positioned on one point of the circumference. Accordingly, since the specific target can be moved on the focal point of the laser beam when the disk rotates, the target being deposited can be selected.

Secondly, the target should be rotated. The deposition can be started when the laser beam is positioned on one predetermined target. However, if the deposition is performed on only one fixed point of the target, a composition transformation of the material occurs because of a heat concentration by a high laser energy concentrated on the fixed point, thereby this composition transformation directly exerts a bad influence upon the composition of the thin film grown on the substrate.

In addition, when a polishing is performed on the target material in order to attain the same composition as the material in the next deposition run, the target material (commonly, a target's diameter is over 25 mm) of area beside the focal point is discarded. Therefore, in order to eliminate the aforementioned problems, the target should be rotated.

SUMMARY OF THE INVENTION

Accordingly, the present invention is directed to a multi-target manipulator for a pulsed laser deposition apparatus that substantially obviates one or more of the problems due to limitations and disadvantages of the conventional art.

It is an objective of the present invention to provide a multi-target manipulator for a pulsed laser deposition apparatus which rotates a target and a target disk at the same time, and has a mechanical structure for a control automation. It is also an objective of the present invention to provide a multi-target manipulator for a pulsed laser deposition apparatus which grows a thin film having both a high quality and a repeatability, automatizes a deposition apparatus, and economically performs a pulsed laser deposition, when a thin film is grown by using a pulsed laser deposition apparatus.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve the above objects, a multi-target manipulator for a pulsed laser deposition apparatus according to the present invention includes:

a driving power providing member which includes: a stepping motor which rotates both a target disk driving shaft and a target driving motor shaft; and a motion feedthrough which is connected to one end of the stepping motor, thereby providing a rotation driving power to the target disk driving shaft and the target driving motor shaft;

a driving power transmission and head supporting member, which include: a mounting flange which is installed to one end of the driving power providing member and connected to a vacuum chamber; a target disk driving motor shaft which has a target disk driving active gear being meshed with a target disk driving passive gear of the target disk driving shaft; a target disk driving shaft which has the target disk and transmits a rotation driving power necessary to a rotation of the target disk; a head supporting frame which supports a head of a multi-target manipulator by connecting its one side to the mounting flange; and a target driving motor shaft which penetrates a center of the target disk driving shaft and transmits a rotation driving power for rotating the target, thereby transmitting a rotation driving power necessary for rotating both the target disk provided from the driving power providing member and the target and supporting the head of the target manipulator; and a head portion which includes: a target disk for being connected to one side of the target disk driving shaft, and rotatably moving a specific target among several targets mounted on the one side of the target disk driving shaft on a focal point of a laser beam; a target driving active gear for being connected to one side of the target driving motor shaft, and rotatably moving target driving passive gears arranged on a circumference of the one side of the target driving motor shaft with an equal distance therebetween; and a plurality of target driving shafts in which one end is mounted on the target disk, the target driving passive gears are mounted on one sides of the target driving shafts, and other end mounts a target holder fixing stub and a target holder thereon in order to rotatably move the target holder, thereby performing rotations of the target disk and the target so as to locate a target material on the focal point of the laser beam.

It is to be understood that both the foregoing general description and the following detailed description are exemplary and explanatory and are intended to provide further explanation of the invention as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2 is a side view illustrating an orthogonal type multi-target manipulator in accordance with another preferred embodiment of the present invention;

DETAILED DESCRIPTION OF THE INVENTION

The preferred embodiment of the present invention will become apparent from a study of the following detailed description, when viewed in light of the accompanying drawings.

Figure 1:
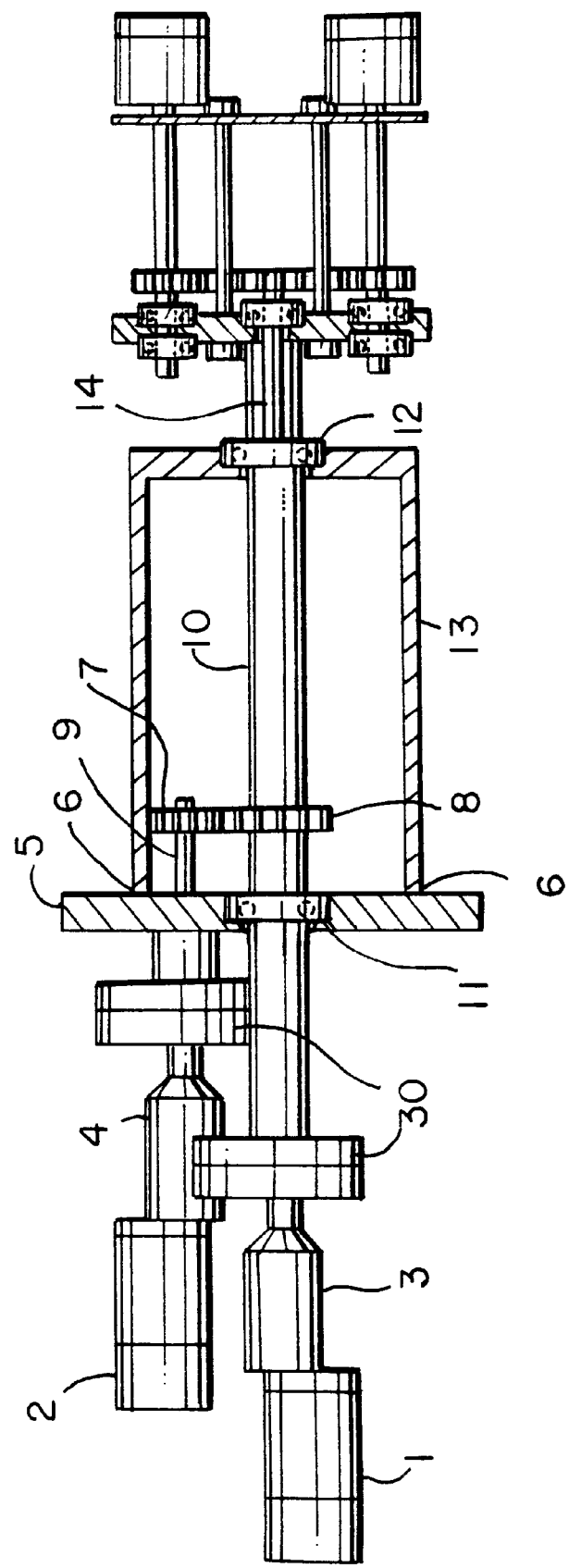
FIG. 1 is a side view illustrating a parallel type multi-target manipulator in accordance with a preferred embodiment of the present invention.
Figure 3B:
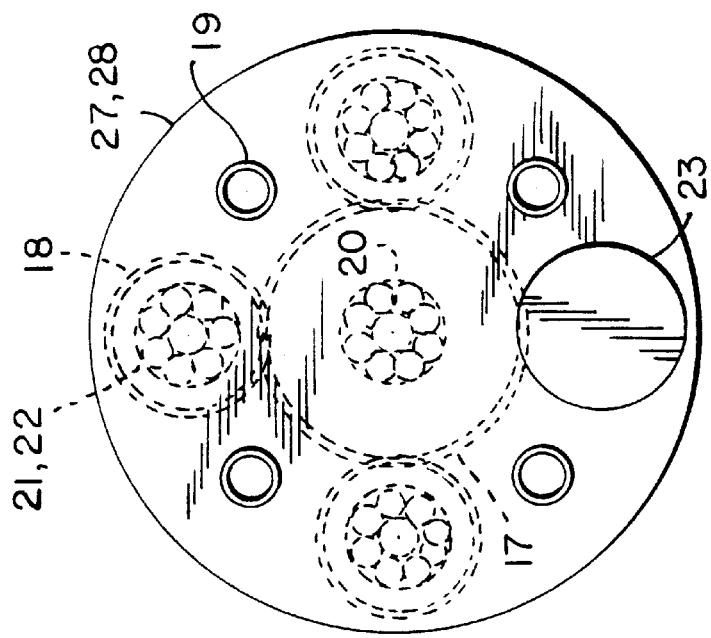
FIG. 3B is a front view illustrating a head portion of a multi-target manipulator having a single target disk manipulator in accordance with the present invention.
Figure 3A:
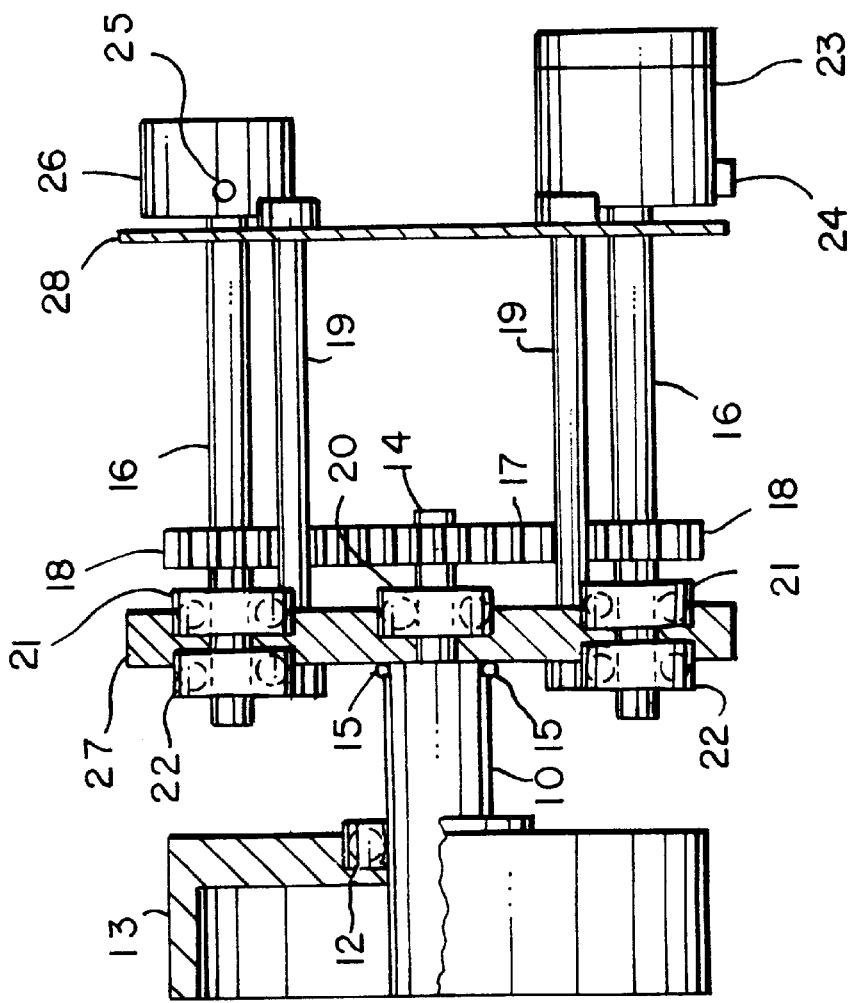
FIG. 3A is a side view illustrating a head portion of a multi-target manipulator having a single target disk manipulator in accordance with the present invention.
Figure 4B:
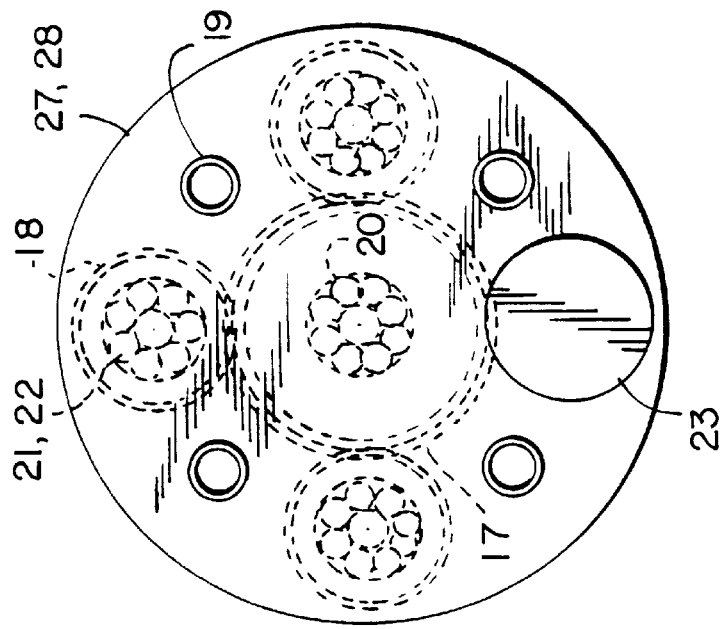
FIG. 4B is a front view illustrating a head portion of a multi-target manipulator having a double target disk manipulator in accordance with the present invention.
Figure 4A:
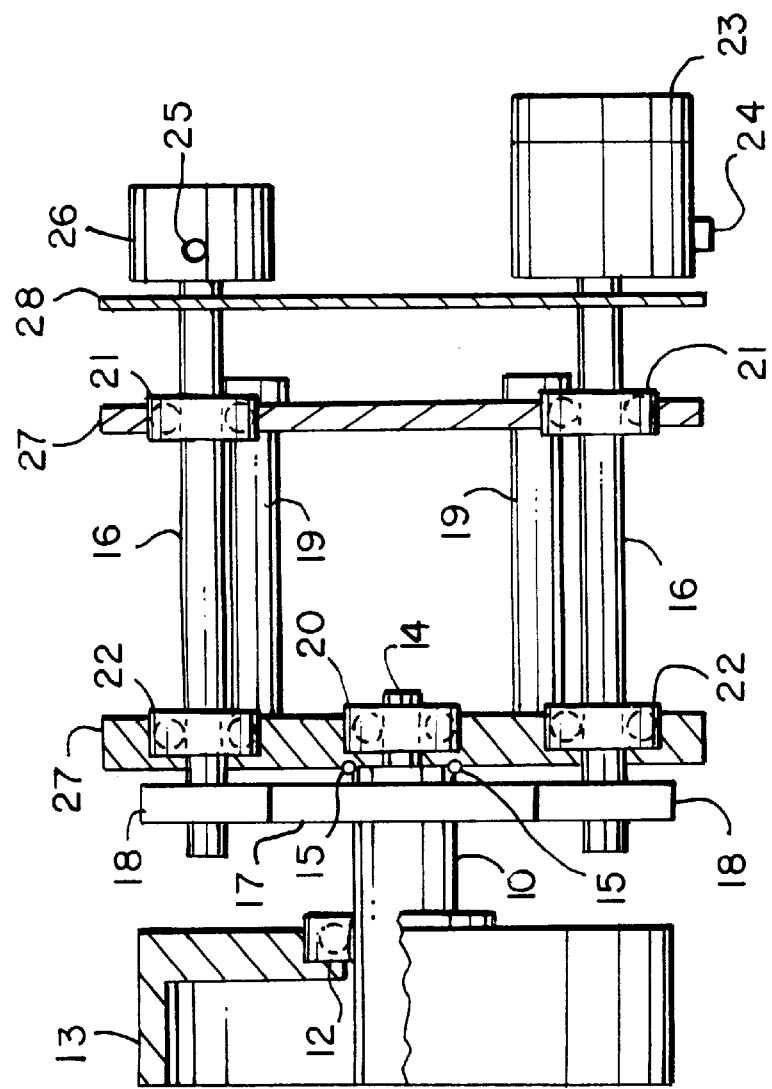
FIG. 4A is a side view illustrating a head portion of a multi-target manipulator having a double target disk manipulator in accordance with the present invention.

FIG. 1 is a side view illustrating a parallel type multi-target manipulator in accordance with a preferred embodiment of the present invention; FIG. 2 is a side view illustrating an orthogonal type multi-target manipulator in accordance with another preferred embodiment of the present invention; FIG. 3A is a side view illustrating a head portion of a multi-target manipulator having a single target disk manipulator in accordance with the present invention; FIG. 3B is a front view illustrating a head portion of a multi-target manipulator having a single target disk manipulator in accordance with the present invention; FIG. 4A is a side view illustrating a head portion of a multi-target manipulator having a double target disk manipulator in accordance with the present invention; and FIG. 4B is a front view illustrating a head portion of a multi-target manipulator having a double target disk manipulator in accordance with the present invention.

There are three kinds of designs regarding the multi-target manipulator according to the present invention as follows:

(1) Each target's manipulation design;

(2) Target rotating plate's manipulation design; and (3) Structure supporting design As shown in FIGS. 1 and 2, all targets 23 are driven by the motors 1 and 2 being rotated outside of the vacuum with an equal rotative speed. At this time, the rotating powers of the motors 1 and 2 are transmitted to the target driving motor shaft 14 inside of the vacuum through motion feedthroughs 3 and 4.

As shown in FIGS. 3 and 4, this rotating power is transmitted to both the target driving active gear 17 mounted to one end of the target driving motor shaft 14, and a target driving passive gear 18 mounted to a plurality of target driving shafts 16, thereby rotating the target driving shaft 16.

Two kinds of the target power transmission methods are possible in the present invention, which basic conceptions are identical.

In a first method, as shown in FIG. 1, the target disk driving motor shaft 9 is parallel to the target driving motor shaft 14. While this power transmission system can perform a stable rotating power transmission rather than the following vertical type, it occupies a large space toward a vertical direction because two motor mounting flanges 30 are laid in parallel.

In a second method, as shown in FIG. 2, two power transmission shafts 9 and 14 are vertical therebetween, and such a power transmission is achieved by one pair of bevel gears. While the second power transmission system cannot perform a more stable rotating power transmission than the above parallel type, it can be mounted to even narrow space because two motor mounting flanges 30 are vertically laid.

The most important thing in a target manipulator, as shown in FIGS. 3 and 4, is that the rotating target driving shaft 16 should not wobble in the center of the shaft, and the shaft 16 should maintain a vertical state when the shaft 16 is supported on the target disk 27. If the shaft 16 wobbles, the laser beam's focal point on the target surface cannot be constantly maintained. Accordingly, the wobbling of the shaft 16 causes unstable state during the laser ablation, thereby exerting a bad influence upon the composition of the thin film and the uniformity of the thickness thereof.

To obviate this problem, the present invention installs both a front target driving shaft support bearing 21 and a rear target driving shaft support bearing 22 around each target driving shaft 16 contacted with the target disk 27. In this case, the two bearings 21 and 22 are mounted to the front and rear sides of the target disk 27 as shown in FIG. 3, or respectively mounted to contact portions between the shaft 16 and two target disks 27 as shown in FIG. 4. As a result, an overall design is integrated to fix a plurality of target driving shafts 16 on the target disk 27.

In addition, a target holder fixing stub 26 is mounted in another end of each target driving shaft 16 in order to connect the target holder 23. At this time, a distance from the stub 26 to the target disk 27 near to the power transmission gear sets 17 and 18 keeps a constant interval barring a transformation of the shaft. The reason why this distance keeps the constant interval is for maximally preventing variations of the apparatus or the rotating power, due to a radiant heat of heat source corresponding to the target surface.

Also, a metallic heat-proof plate 28 is mounted as a direct method for protecting the apparatus from the heat source. In mounting the metallic heat-proof plate 28, a combination type of long bolts and nuts is used to determine a position of the plate 28. In order to fix the heat-proof plate 28 to an accurate position, it is desirable that at least three (or four) interval maintaining bolts 19 (or rods) are mounted at intervals of 120° therebetween.

In the meantime, the number of the mounted targets can be voluntarily controlled according to the usage and purpose of the apparatus. A standard of the single crystal material being used as a target is a diameter of 25 mm and thickness of 6 mm. According to its usage, the size of the single crystal can be controlled. The target holder 23 mounting the single crystal material is fixed to the target holder fixing stub 26 mounted to one side of the target driving shaft 16, by using the target holder fixing screw 24. At this time, an inner diameter of the target holder 23 is identical with an outer diameter of the stub 26, thus the target integrates the target driving shaft 16 as one body.

Figure 5:
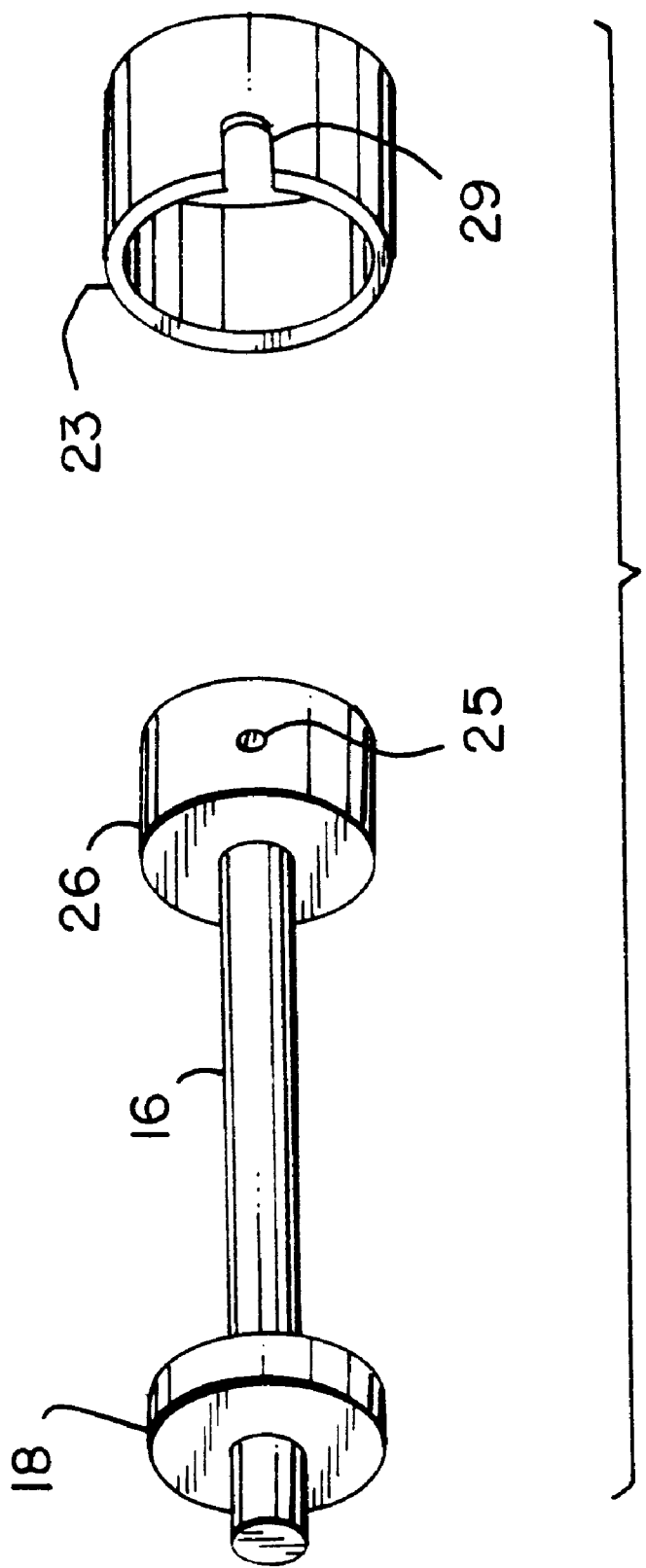
FIG. 5 is an exploded perspective view illustrating a target moving shaft and a target holder of a multi-target disk manipulator in accordance with the present invention.

As shown in FIG. 5, in order to easily separate the target holder 23 from the target holder fixing stub 26, a screw groove 29 whose one end is open is formed on a position of the target holder 23 at which the fixing screw 24 is fixed. That is, the target holder 23 can be separated from the stub 26 without a complete separation of the screw 24, if the screw is adequately loosened.

Also, the target disk 27 including all targets thereon is made to be rotated through the target disk driving shaft 10 in order to select the target needed to the deposition. In this case, when the inner target driving motor shaft 14 is isolated from the outer target disk driving shaft 10, the target driving motor shaft 14 passing through the center of the target disk driving shaft 10 is not affected by the shaft 10.

In addition, a coupling portion 10 between the target disk 17 and the target disk driving shaft 10 is welded and is formed by a bolt coupling as one body. This integrated structure uses the same material as a stainless steel. The reason why the integrated structure uses the same material as a stainless steel is that the target disk 27 including a bearing for supporting the target is faced with a front heat source in a vertical direction, so that the target disk 27 is directly exposed to the heat, thereby causing a transformation during a long laser ablation.

As described above, if the target disk 27 is integrated with the target disk driving shaft 10 as one body of the same material, an uniform transformation is induced when a structure is transformed by the heat. Accordingly, an obstacle of the rotation of a driving body can be minimized.

In the meantime, the head supporting frame 13 of the multi-target manipulator according to the present invention connects the multi-target manipulator of the inside vacuum to the motors 1 and 2 of the outside vacuum.

In a pulsed laser deposition apparatus, a focal point's position of the laser beam and the target's position should be positioned in the center of the vacuum chamber, so that the pulsed laser deposition apparatus maintains an interval by the target disk driving shaft 10 and the target driving motor shaft 14. Accordingly, a supporting structure which always keeps the target located to an accurate position simultaneously with bearing a weight of the head of the multi-target manipulator, is required. For this purpose, it is desirable that the head supporting frame 13 is formed as a cylindrical structure whose one end is open or formed as a truss structure. In this case, although any type structures are used for the frame 13, at least two support bearings 20 and 21 for supporting the target disk driving shaft 10 in both sides of the frame 13 should be mounted in the front and rear of the target disk driving shaft 10. Then, a coupling portion 6 between the frame 13 and the mounting flange 5 is welded and formed by a bolt coupling as one body.

The aforementioned multi-target manipulator for the pulsed laser deposition apparatus includes the following effects.

i) DOUBLE MOTION:

This effect makes each target rotate with a high-speed, and smoothly performs a rotation of the target disk. A rotation power is transmitted from the outside of the vacuum chamber. At this time, the motion feedthrough 3 and 4 for the vacuum are used not to destroy the inner vacuum of the inside vacuum chamber. In addition, the rotating power about the target and the target disk uses each independent motors 1 and 2, or is generated by one common motor.

ii) INTEGRATION:

The target disk driving shaft 10 is mechanically integrated with the target driving shaft 14 as one body in the present invention. The target driving motor shaft 14 is positioned in the center of the target disk driving shaft 10. That is, a shaft center of the target disk is identical with that of the target. At this time, the rotation of each target ranges from the active gear 17 fixed to the motor shaft 14 to the passive gear 18 connected to the target driving shaft 16, thereby receiving the rotating power. Accordingly, if the active gear 17 rotates, all targets mounted to the passive gear 18's shaft meshed with the gear 17 rotates with the same angular velocity. Such rotation of the target continues while the target disk 27 moves to a deposition positioned on the next target.

iii) CONTROL AUTOMATION:

Two kinds of rotations of the target disk and the target with respect to the multi-target manipulator can be synchronized with the laser's operation. A control automation can be achieved by using a microprocessor and computer. To achieve the control automation, a stepping motor being controlled by a program is used as motors 1 and 2 mounted to outside vacuum. Synthetically, the automatic control system for the operations (e.g., the target's driving and temperature adjustments of the laser and substrate) of the laser ablation system can be achieved. Also, this control automation can easily perform an effective growth of a multilayer thin film, a thickness control and thin film layer adjustment with respect to a growth of a different kind of a thin film layer.

iv) ECONOMIC EFFICIENCY:

As described above, since the conventional laser ablation uses a target which rotates at the fixed shaft, a laser plume occurs on only one circumferential point at which a focal point of the laser of the target material is positioned. This restricts to use surfaces of all targets during the laser ablation. However, if the control automation proposed by the present invention is used, each manipulator can be minutely driven according to a control program. Therefore, by this minute driving, all surfaces of the target material can be used in the laser ablation.

Commonly, in the laser ablation, a target surface used in the previous growth should be cleaned by a polishing before performing a new thin film growth. If a constant surface of the target material is integrated with a high energy and a long laser ablation is performed, a composition of the target is changed and columnar grains on the target material surface are sloped toward an incident direction. Due to this phenomenon, a composition of a grown thin film is different from that of the target, and the thickness of the grown thin film is not uniform. Accordingly, the most simple method for preventing the phenomenon is that a surface of the target used for growing the thin film having a constant thickness is rubbed by a sandpaper.

However, if the control automation according to the present invention is used, a deposition position on the target surface can be minutely controlled. As a result, by only one polishing, the deposition can be performed for a long time, thereby more enhancing an economical efficiency in an apparatus maintenance.

In addition, a rotating direction of the target is converted to a reverse direction during performing the deposition, thereby reversely using the phenomenon wherein the columnar grains are sloped. It also attains an effect wherein the target material's surface is reproduced without a polishing. As described above, the target manipulator's automation according to the present invention maximizes the use of target materials of high-price and high-purity, and thus can economically perform the laser ablation.

As described above, the multi-target manipulator according to the present invention rotates a target and a target disk at the same time, and has a mechanical structure for a control automation. Also, the multi-target manipulator grows a thin film having both a high quality and a repeatability, automatizes a deposition apparatus, and economically performs a pulsed laser deposition, when a thin film is grown by using a pulsed laser deposition apparatus.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A multi-target manipulator for a pulsed laser deposition apparatus, comprising:
    a driving power transmission and head supporting member comprising:
        a mounting flange connected to a vacuum chamber;
        a target disk driving motor shaft connected to said mounting flange, said target disk driving motor shaft having a target disk driving active gear meshed with a target disk driving passive gear;
        a target disk driving shaft connected to said mounting flange;
        a head supporting frame connected to said mounting flange;
        a target driving motor shaft coaxially displaceable so as to penetrate a center of said target disk driving shaft, said target driving motor shaft transmitting a rotation driving power for rotating a target;
    a head portion supported by said head supporting frame and said target driving motor shaft, said head portion comprising:
        a target disk connected to one side of said target disk driving shaft, said target disk driving shaft rotating said target disk to a specific target among several targets on the one side of said target disk driving shaft on a focal point of a laser beam;
        a target driving active gear connected to one side of said target driving motor shaft;
        rotatably movable target driving passive gears arranged on a circumference of the one side of said target driving motor shaft with an equal distance therebetween;
        a plurality of target driving shafts, each having one end mounted to said get disk and to the target driving passive gears;
        a target holder fixing stub connected to an opposite end of said plural target driving shafts;
        a target holder for supporting said target holder fixing stub, said target holder being rotatable by said plural target driving shafts which, in turn, rotate said target disk and the target so as to locate a target material on the focal point of the laser beam; and
    a driving power providing member comprising:
        a stepping motor operatively connected so as to rotate said target disk by rotating both said target disk driving shaft and said target driving motor shaft;
        a motion feedthrough connected to one end of said stepping motor for providing rotation driving power to said target disk driving shaft and said target driving motor shaft.

2. The multi-target manipulator in accordance with claim 1, wherein said target disk driving motor shaft and said target driving motor shaft are parallel to one another.

3. The multi-target manipulator in accordance with claim 1, wherein said target disk driving motor shaft and said target driving motor shaft are power transmission shafts arranged perpendicular to one another.

4. The multi-target manipulator in accordance with claim 1, further comprising:
    two front target driving shaft support bearings mounted in front of each target driving shaft in a contact region between said target driving shaft and said target disk;
    two rear target driving shaft support bearings mounted in back of each target driving shaft in a contact region between said target driving shaft and said target disk;

wherein said front and rear target driving shaft support bearings are disposed so as to reduce wobbling in a center of the target driving shaft during rotation and substantially maintaining said target driving shaft perpendicular to said target disk.

5. The multi-target manipulator in accordance with claim 1, further comprising:

another target disk mounted parallel to said target disk so as to reduce wobbling in a center region of said target driving shaft and substantially maintain said target driving shaft perpendicular to said target disks; and one front target driving shaft support vacuum bearing mounted to a front side of said target disks; and one rear target driving shaft support vacuum bearing mounted to a back side of said target disks.

6. The multi-target manipulator in accordance with claim 1, further comprising:

another target disk mounted parallel to said target disk so as to reduce wobbling in a center region of said target driving shaft and substantially maintain said target driving shaft perpendicular to said target disk; and one front target driving shaft support vacuum bearing mounted to contact portions between said target driving shaft and said target disks; and one rear target driving shaft support vacuum bearing mounted to contact portions between said target driving shaft and said target disks.

7. The multi-target manipulator in accordance with claim 1, wherein said target holder has a circumference with a screw groove having an open end defined therein, the open end of the screw groove being disposed in said target holder so that to receive a fixing screw, if the fixing screw is in a in a tightened state said target holder fixing stub is fixed to said target holder, and if the fixing is in a loosened state said target holder fixing stub is displaceable away from said target holder.

8. The multi-target manipulator in accordance with claim 1, further comprising:

a heat-proof plate mounted to said target holder fixing stub on an opposite side from the one side connected to said target holder; and a plurality of interval maintaining rods having one end mounted to said target disk and an opposite end mounted to said heat-proof plate so as to fix said heat-proof plate in a predetermined position.

9. The multi-target manipulator in accordance with claim 1, wherein said target disk and said target disk driving shaft are made from the same material so as to induce a substantially uniform transformation during transformation of a structure by heat; and, further comprising a bolt coupling welded between said head supporting frame and said mounting flange so as to form a single structure.

10. The multi-target manipulator in accordance with claim 1, wherein said head supporting frame is a cylinder having an open end; and, further comprising a bolt coupling welded between said head supporting frame and said mounting flange so as to form a single structure.

11. The multi-target manipulator in accordance with claim 1, wherein said head supporting frame is a truss; and, further comprising a bolt coupling welded between said head supporting frame and said mounting flange so as to form a single structure.

12. The multi-target manipulator in accordance with claim 10, further comprising:

two support bearings for mounting said target disk driving shaft at both ends of said head supporting frame.

13. The multi-target manipulator in accordance with claim 11, further comprising:

two support bearings for mounting said target disk driving shaft at both ends of said head supporting frame.

* * * * *